United States Patent [19]
Knickerbocker et al.

[11] Patent Number: 5,260,519
[45] Date of Patent: Nov. 9, 1993

[54] MULTILAYER CERAMIC SUBSTRATE WITH GRADED VIAS

[75] Inventors: John U. Knickerbocker, Hopewell Junction; Charles H. Perry, Poughkeepsie; Donald R. Wall, Wappingers Falls, all of N.Y.

[73] Assignee: International Business Machines Corporation, Armonk, N.Y.

[21] Appl. No.: 949,595

[22] Filed: Sep. 23, 1992

[51] Int. Cl.$^5$ ............................................. H05K 1/00
[52] U.S. Cl. ................................ 174/262; 174/257; 174/264
[58] Field of Search ............ 174/257, 262, 264; 361/412, 414, 411; 428/901; 427/97

[56] References Cited

U.S. PATENT DOCUMENTS

| | | | |
|---|---|---|---|
| 4,234,367 | 11/1990 | Herron et al. | 156/89 |
| 4,301,324 | 11/1981 | Kumar et al. | 174/68.5 |
| 4,594,181 | 6/1986 | Siuta | 252/512 |
| 5,029,242 | 7/1991 | Sammet | 174/257 |
| 5,073,180 | 12/1991 | Farooq et al. | 65/18.4 |

OTHER PUBLICATIONS

IBM patent application, Ser. No. 07/758,991, Filed Sep. 10, 1991, F. Y. Aoude et al., "Copper-Based Paste Containing Copper Aluminate For Microstructural and Shrinkage Control of Copper-Filled Vias".

*Primary Examiner*—Leo P. Picard
*Assistant Examiner*—Cheryl R. Figlin
*Attorney, Agent, or Firm*—Ira David Blecker

[57] ABSTRACT

Disclosed is a multilayer ceramic substrate for electronic applications including:
(a) at least one internal layer having vias filled with a metallic material;
(b) at least one sealing layer having vias filled with a composite material that is a mixture of ceramic and metallic materials; and
(c) at least one transition layer located between the internal and sealing layers having vias filled with a composite material that is a mixture of ceramic and metallic materials but having less ceramic and more metallic material than the sealing layer vias and less metallic material than the internal layer vias.

Also disclosed is a method of forming the multilayer ceramic substrate.

32 Claims, 2 Drawing Sheets

MULTILAYER CERAMIC SUBSTRATE WITH GRADED VIAS

RELATED APPLICATION

This application is related to Knickerbocker, et al., U.S. patent application Ser. No. 07/949,598, entitled "MULTILAYER CERAMIC SUBSTRATE WITH CAPPED VIAS", filed even date herewith.

BACKGROUND OF THE INVENTION

This invention relates to multilayer ceramic substrates, and more particularly relates to multilayer ceramic substrates useful for electronics packaging and to a method for making such substrates.

Glass, ceramic and glass ceramic (hereinafter just ceramic) structures, usually and preferably multilayered, are used in the production of electronic substrates and devices. Many different types of structures can be used, and a few of these structures are described below. For example, a multilayered ceramic circuit substrate may comprise patterned metal layers which act as electrical conductors sandwiched between ceramic layers which act as insulators. The substrates may be designed with termination pads for attaching semiconductor chips, connector leads, capacitors, resistors, covers, etc. Interconnection between buried conductor levels can be achieved through vias formed by metal paste-filled holes in the individual ceramic layers formed prior to lamination, which, upon sintering will become a sintered dense metal interconnection of metal based conductor.

In general, conventional ceramic structures are formed from ceramic green sheets which are prepared by mixing a ceramic particulate, a thermoplastic polymeric binder, plasticizers and solvents. This composition is spread or cast into ceramic sheets or slips from which the solvents are subsequently volatilized to provide coherent and self-supporting flexible green sheets. After blanking, via formation, stacking and laminating, the green sheet laminates are eventually fired at temperatures sufficient to drive off the polymeric binder resin and sinter the ceramic particulates together into a densified ceramic substrate.

The electrical conductors used in formation of the electronic substrate may be high melting point metals such as molybdenum and tungsten or a noble metal such as gold. However, it is more desirable to use a conductor having a low electrical resistance and low cost, such as copper and alloys thereof.

Present state-of-the-art ceramic substrates are made from cordierite glass-ceramic particulate materials such as that disclosed in Kumar et al. U.S. Pat. No. 4,301,324. These substrates exhibit a dielectric constant of about 5 and a thermal coefficient of expansion (TCE) that closely matches that of silicon. It is desirable to fabricate substrates out of low dielectric constant materials so as to increase signal propagation speed, which varies inversely with the square root of the dielectric constant.

Prior to the cordierite glass-ceramic materials, alumina for a number of years had been an adequate dielectric material for microelectronic packaging. Alumina, however, has a dielectric constant approaching 10 which causes high signal propagation delay and low signal-to-noise ratio. Further, alumina has a TCE about twice as high as silicon which impacts the thermal fatigue resistance of the package. For low end applications, however, alumina (as well as other similar materials having a dielectric constant of about 10 and below) will be used for some time to come.

The present inventors, however, have discovered a vexing problem that is applicable to many multilayer ceramic materials and substrates fabricated therefrom.

It has been found by others that the vias do not completely seal to the ceramic material, thereby possibly resulting in a gap between the metallic via and the ceramic bulk material. This gap is undesirable as it reduces the hermeticity of the fabricated substrate as well as allowing fluids to seep into the substrate during processing. Accordingly, it has been proposed in Farooq et al., U.S. Pat. No. 5,073,180, the disclosure of which is incorporated by reference herein, to seal at least the top layer of a multilayer ceramic substrate with a composite via material consisting of metallic and ceramic (including glass) materials. The internal vias are essentially all metal. As taught by Siuta U.S. Pat. No. 4,594,181, the internal vias may also include small amounts of alumina or other ingredients to inhibit the densification of the metallic via.

What the present inventors have found is that at the interface between the composite sealing via and the metallic internal via, and/or at the interface between the internal via and the bulk ceramic, there is a mismatch of thermal coefficients of expansion and some difference in densification behavior during cofiring, which makes the interface susceptible to fatigue failure when the substrate is exposed to thermal stress during post-firing processing. The result is that an unrepairable open may occur at one of the above interfaces within the substrate. If the net containing the open cannot be rerouted, the entire substrate must be scrapped.

It is, therefore, a purpose of the present invention to have a substrate which does not suffer from such thermal fatigue-enhanced opens.

It is another purpose of the present invention to have a process for making such a substrate.

These and other purposes of the present invention will become more apparent after referring to the following description of the invention considered in conjunction with the accompanying drawings.

BRIEF SUMMARY OF THE INVENTION

The purposes of the invention have been achieved by providing, according to a first aspect of the invention, a multilayer ceramic substrate for electronic applications comprising:
  (a) at least one internal layer having vias filled with a metallic material;
  (b) at least one sealing layer having vias filled with a composite material that is a mixture of ceramic and metallic materials; and
  (c) at least one transition layer located between the internal and sealing layers having vias filled with a composite material that is a mixture of ceramic and metallic materials but having less ceramic and more metallic material than the sealing layer vias and less metallic material than the internal layer vias.

According to a second aspect of the invention, there is provided a method of fabricating a multilayer ceramic substrate for electronic applications, the multilayer ceramic substrate comprising at least one internal layer having vias filled with a metallic material and at least one sealing layer having vias filled with a composite material that is a mixture of ceramic and metallic materials, the method comprising the step of:

interposing at least one transition layer between the internal layer and the sealing layer, the transition layer having vias filled with a composite material that is a mixture of ceramic and metallic materials but having less ceramic and more metallic material than the sealing layer vias and less metallic material than the internal layer vias.

DETAILED DESCRIPTION OF THE INVENTION

The present invention is applicable to multilayer ceramic substrates for electronic applications. The preferred embodiment of the invention is directed to multilayer ceramic substrates comprising glass ceramic layers and copper vias. However, the present invention is believed to be applicable to other material combinations as well, such as palladium, gold and silver in low fired MLC substrates such as borosilicate glasses that include ceramic additives (so-called glass plus ceramics). As another example, alumina substrates typically have tungsten or molybdenum internal vias and tungsten or molybdenum plus glass sealing vias. There is the potential for increased stress at the interface of these two types of vias; therefore, it is believed that a transition layer according to the present invention would be useful for this material combination as well.

Figure 1:
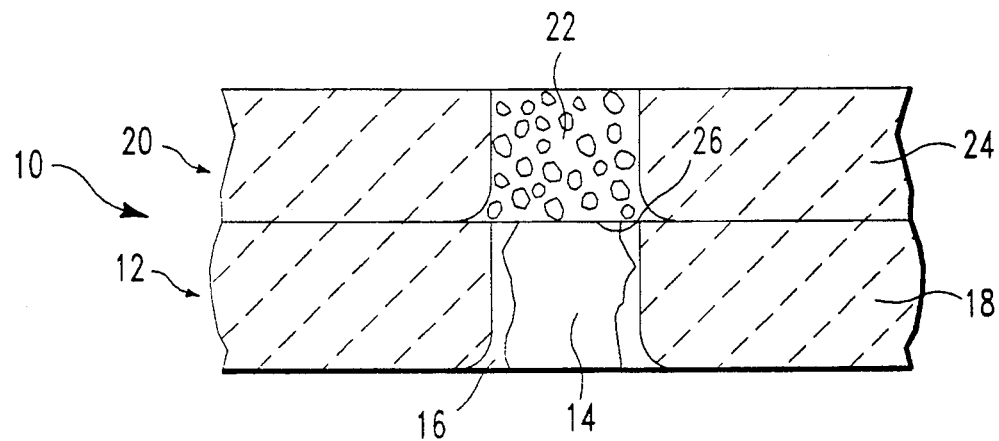
FIG. 1 is a partial cross sectional view of a prior art multilayer ceramic substrate.

Referring to the Figures in more detail and particularly referring to FIG. 1, there is shown the prior art arrangement of layers in a multilayer ceramic (hereinafter MLC) substrate 10. Internal layer 12 has vias 14 which are filled with a conductive metal. As is well known, there will usually be a plurality of such internal layers 12 as these layers carry substantially all of the internal wiring of the substrate. Further, so as to keep the resistivity of the substrate to a minimum, the vias 14 and all the wiring consist predominately of a conductive metal. It has been found that certain ceramic additives, such as alumina, or other alloying additives and/or organic additives are useful to control the densification of the conductive metal so as to more closely approximate the densification rate of the surrounding ceramic bulk. These other additives may be present from the parts per million range up to several percent depending on the function and perceived need of the additive. It is, of course, well known that increasing the amount of the inorganic additive increases the resistivity of the fired metallic conductor so it is preferred to keep these additives to a minimum. The determination of the exact composition of the vias 14 is well within the competence of a person skilled in the art.

Notwithstanding the presence of the additives, such as alumina, mentioned above, it happens that a gap 16 is formed between the via 14 and the ceramic 18. In order to avoid the intrusion of liquids during processing and to otherwise maintain the hermeticity of the substrate 10, a sealing layer 20 may be added to the substrate 10. As can be seen from FIG. 1, there is no gap between via 22 and ceramic 24. Via 22 in sealing layer 20 is a composite material made of ceramic material and conductive metal. The so-called composite via is made so as to densify during co-firing very closely to that of the ceramic 24 and is designed so as to have a thermal coefficient of expansion (TCE) approaching that of the ceramic 24. In order to accomplish this, via 22 has a very high percentage of glass, perhaps 50 volume % or more. So, while via 22 approaches the TCE of ceramic 24, the TCE of via 22 varies considerably from that of via 14.

The present inventors have found the difference in TCE between vias 14 and 22 and between via 14 and the bulk ceramic, as well as the difference in conductive metal content of the two vias, causes an increase in stress at the interface 26 between vias 14 and 22. During thermal cycling, interface 26 may become susceptible to thermal fatigue, resulting in a break in the via at or near interface 26, thereby causing an open in the electrical net of which vias 14 and 22 form a part.

The inventors have therefore proposed a transition layer according to the invention between the internal layer and the sealing layer.

Figure 2:
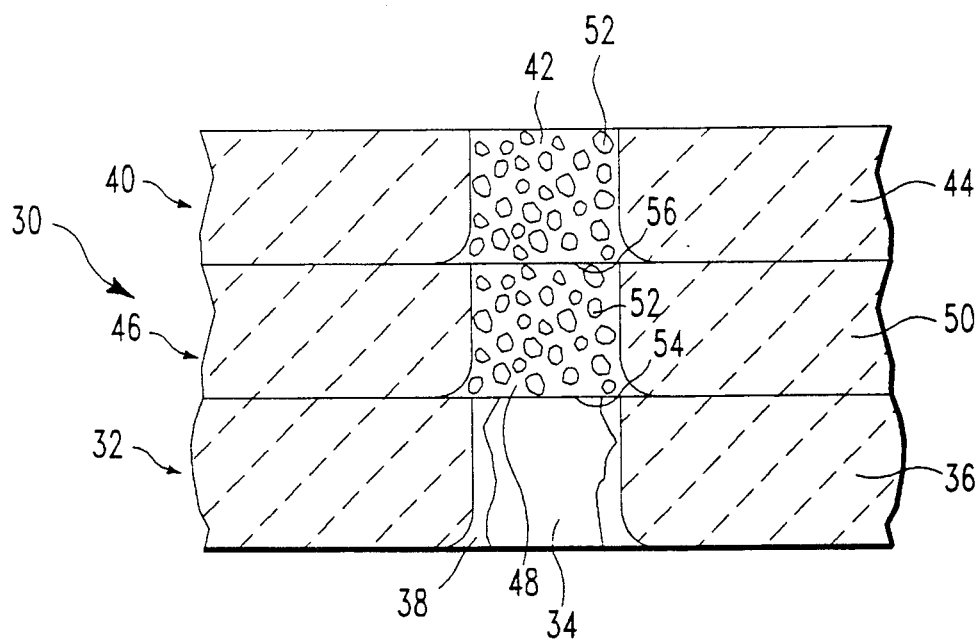
FIG. 2 is a partial cross sectional view of a multilayer ceramic substrate with graded vias according to the present invention.

Referring now to FIG. 2, there is shown an MLC substrate 30 according to the present invention. The substrate 30 has at least one internal layer 32 having vias 34 filled with a metallic material. There may be a gap 38 between the via 34 and ceramic 36. Substrate 30 also has at least one sealing layer 40 having vias 42 filled with a composite material that is a mixture of ceramic and metallic materials. Finally, there is at least one transition layer 46 located between the internal layer 32 and sealing layer 40. The transition layer 46 has vias 48 filled with a composite material that is a mixture of ceramic and metallic materials. In the case of transition layer vias 48, however, there is less ceramic material but more metallic material than in the vias 42 of sealing layer 40 and less metallic material than in the vias 34 of internal layer 32. The relationship between vias 34, 42 and 48 is readily apparent in FIG. 2 where it can be seen that via 42 has the -most ceramic particles 52, via 48 has fewer ceramic particles 52 and via 34 has the least or predominately no ceramic particles 52, although as noted earlier, via 34 may contain certain ceramic and/or other additives to control densification and resistivity. If via 34 does contain ceramic material additives, they will be in a quantity that is less than that present in via 48.

While there is only one via shown in each layer for the sake of clarity, there will typically be a plurality of such vias in each layer.

Again, there is a gap between via 34 and ceramic 36 in layer 32. As expected, there is no gap between via 42 and ceramic 44 in layer 40. Now, in the present invention, there is also very little or no gap between via 48 and ceramic 50 in layer 46.

The inventors have found that by grading the vias in the internal, transition and sealing layers, the stresses that would ordinarily develop at interfaces 54 and 56 are markedly reduced, thereby substantially eliminating the former problem of opens.

While not wishing to be held to any particular theory, the present inventors believe that the transition layer works in that one potentially bad interface is replaced with two good interfaces. One new interface is between vias 42 and 48 and the other new interface is between vias 48 and 34. As to the first new interface, near perfect densification match is obtained between the vias, there is full pinning of both vias so there is no strain concentration, ceramic/ceramic and metal/metal bonding is obtained between the vias, and the TCE of both vias is closer. As to the second interface, there is much greater metal/metal contact area across the interface and the TCE of both vias is closer.

Figure 3:
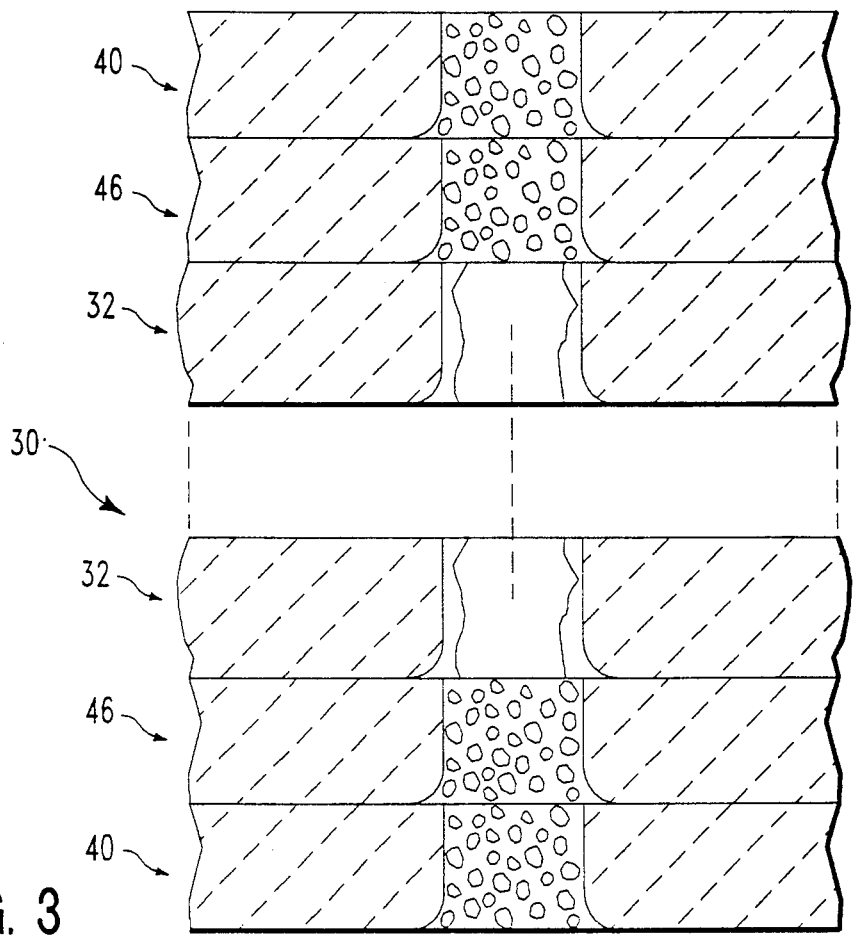
FIG. 3 is a partial cross sectional view illustrating the use of the graded vias according to the present invention for the top and bottom layers of a multilayer ceramic substrate.

In practice, layers 32, 46, and 40 will form the top multiple layers of the substrate 30 with sealing layer 40 being the outermost layer. A second set of layers 32, 46 and 40 will form the bottom multiple layers of the substrate 30 with sealing layer 40 again being the outermost layer, then transition layer 46 and finally internal layer 40, as shown in FIG. 3.

There may, and usually will, be a plurality of internal layers 32 as these layers carry substantially all of the internal wiring of the substrate 30. It may be desirable for there to be a plurality of sealing layers as well. It may also be desirable to have at least one additional transition layer adjacent to one of these plurality of internal layers.

Figure 4:
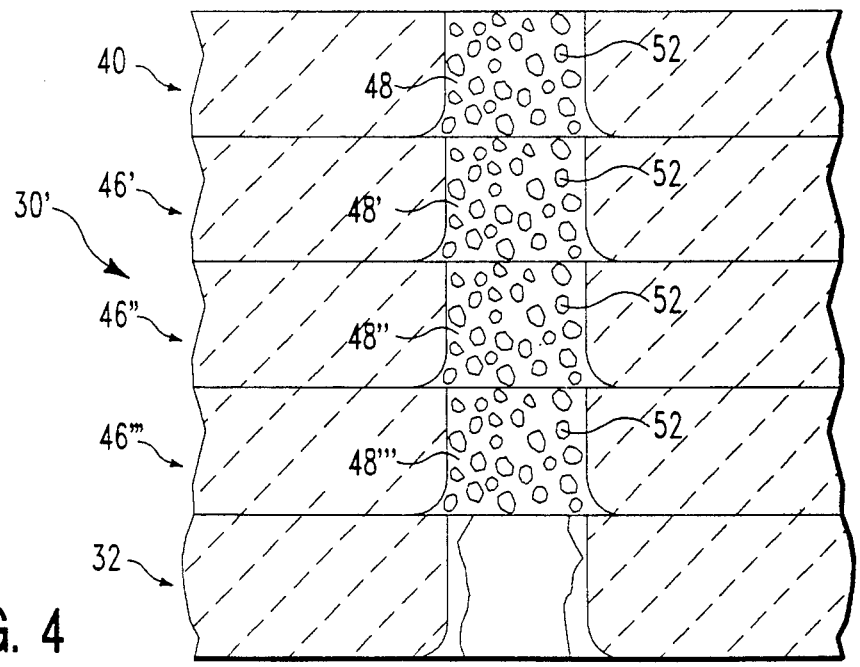
FIG. 4 is a partial cross sectional view of a multilayer ceramic substrate with a plurality of layers of graded vias according to the present invention.

In another variation of the present invention, there may be a plurality of transition layers as shown in FIG. 4. For purposes of illustration and not limitation, there are now three transition layers, 46', 46" and 46'''. There may be more or less than three depending on materials, performance and application. The composition of each of vias 48', 48" and 48''' may be the same. More preferably, vias 48', 48" and 48''' are all composite vias with the amount of ceramic material 52 contained in each via decreasing from via 48' to via 48'''. In this manner, the transition at each interface is extremely gradual, thereby further reducing the possibility of any stress being raised at the interfaces.

In the most preferred embodiment of the invention, the bulk ceramic making up the MLC substrate and the ceramic in the composite vias may be selected from the cordierite and spodumene glass ceramic materials disclosed in the Kumar et al., U.S. Pat. No. 4,301,324 mentioned above. Other glass ceramic materials include, for example, eucryptite and anorthite. Glass ceramic materials are a recognized class of materials which begin as glasses but upon heating undergo devitrification and become at least partially crystallized. Some examples are given in Table I.

The glass ceramic in the composite vias does not need to be the same as that in the bulk ceramic nor does the glass ceramic in the sealing layer vias need to be the same as the glass ceramic in the transition layer vias or the internal layer vias (if the internal layers contain a glass ceramic material, as discussed below). The choice of glass ceramic material is dictated by strength, densification characteristics and TCE. It may also be desirable to add ceramic or other additives, alumina being but one example, to assist in controlling the densification behavior of the composite vias.

The internal layer vias may also contain ceramic material to control densification and TCE. Such ceramic material may include alumina (as discussed previously) and/or glass ceramic materials. If the internal layer vias do contain ceramic materials, it should be in an amount which is less than that present in the transition layer vias.

TABLE 1

| GLASS CERAMIC COMPOSITIONS (WEIGHT PERCENT) | | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| SiO$_2$ | 55.0 | 54.5 | 54.5 | 52.3 | 57.8 | 60.0 | 50.0 | 53.9 | 54.0 | 55.0 | 60.0 | 54.5 |
| Al$_2$O$_3$ | 21.1 | 21.0 | 21.0 | 19.7 | 22.2 | 18.2 | 22.9 | 20.7 | 21.0 | 21.0 | 17.0 | 20.0 |
| MgO | 22.3 | 19.8 | 19.8 | 24.0 | 16.0 | 17.8 | 22.2 | 19.6 | 19.0 | 18.0 | 18.0 | 20.0 |
| B$_2$O$_3$ | 1.3 | 1.0 | 1.0 | 1.0 | 1.0 | 1.0 | 1.1 | 1.0 | 1.0 | 1.0 | 1.0 | 1.0 |
| P$_2$O$_3$ | 0.3 | 2.7 | 2.7 | 3.0 | 3.0 | 3.0 | 1.8 | 2.8 | 3.0 | 3.0 | 3.0 | 1.5 |
| C$_3$O$_2$ | | 1.0 | | | | | | | | | | |
| MnO | | | 1.0 | | | | | | | | | |
| ZrO$_2$ | | | | | | | | | 2.0 | | | 2.0 |
| CaO | | | | | | | | | | 2.0 | | 1.0 |
| NiO | | | | | | | | | | | 2.0 | |
| Li$_2$O | | | | | | | | | | | 1.0 | |
| Fe$_2$O$_3$ | | | | | | | | | | | | |
| Na$_2$O | | | | | | | | | | | | |

| | 13 | 14 | 15 | 16 | 17 | 18 | 19 | 20 |
|---|---|---|---|---|---|---|---|---|
| SiO$_2$ | 57.0 | 55.0 | 47.0 | 53.9 | 54.0 | 54.5 | 54.0 | 54.0 |
| Al$_2$O$_3$ | 21.0 | 21.0 | 33.5 | 20.8 | 22.0 | 21.3 | 22.0 | 21.0 |
| MgO | 20.0 | 22.0 | 13.5 | 19.6 | 20.0 | 19.9 | 20.0 | 22.0 |
| B$_2$O$_3$ | 1.0 | 2.0 | 3.0 | 1.0 | 1.0 | 1.0 | 1.0 | 1.0 |
| P$_2$O$_3$ | 1.0 | | 3.0 | 2.7 | 2.0 | 2.8 | 2.0 | |
| C$_3$O$_2$ | | | | | | | | |
| MnO | | | | | | | | |
| ZrO$_2$ | | | | | | | | |
| CaO | | | | | | | | |
| NiO | | | | | | | | |
| Li$_2$O | | | | | | | | |
| Fe$_2$O$_3$ | | | | | | 2.0 | | |
| Na$_2$O | | | | | | | | |

It has been found that the most preferred composition of the sealing layer vias is 40 to 90 volume % glass ceramic and 60 to 10 volume % metallic material, with the most preferred metallic material being copper. The composition of the transition layer vias may vary depending on the proper balancing of reliability and resistivity. At a minimum, the transition layer vias preferably have about 6 volume % glass ceramic, perhaps as low as 4 volume %, to ensure proper densification characteristics. The maximum glass ceramic should be about 50 volume % in the transition layer vias.

The purposes and advantages of the present invention will become more apparent after referring to the following Examples.

EXAMPLES

Examples I

A number of MLC substrates were fabricated in order to demonstrate the effectiveness of the invention.

There were a total of 17 green glass ceramic laminates prepared in the conventional way such as that disclosed in Herron et al. U.S. Pat. No. 4,234,367. The laminates had a total of 68 layers. The top three and bottom four layers were sealing layers and had vias filled with a paste consisting of, based on the volume % of the solids, 40 volume % copper (particle size predominantly 0.6-1.5 microns) and 60 volume % crystallizable glass (average particle size 3.5 microns). The paste also included conventional binders, flow control agents, etc.

In thirteen of the laminates, there was included a transition layer adjacent to the top and bottom sealing layers as shown in FIG. 3. The transition layer vias in six of the laminates were filled with a paste consisting of, based on the volume % of the solids, 55 volume % copper and 45 volume % crystallizable glass while seven of the laminates were filled with a paste consisting of, based on the volume % of solids, 90 volume % copper and 10 volume % crystallizable glass. The particle size of the copper was predominantly 5.1-7.5 microns while the average size of the crystallizable glass particles was 3.5 microns. The remaining four laminates did not have a transition layer but instead had another sealing layer on the top and bottom. The vias in the remaining internal layers were filled with a copper paste (copper particle size was predominantly 5.1-7.5 microns) with the copper particles coated with anywheres from 0-400 ppm alumina.

The crystallizable glass in the composite vias and the bulk ceramic was the same. The crystallizable glass is of the type shown in Table I.

The laminates were then sintered according to the following schedule. The temperature was ramped up to 705°-725° C. in an atmosphere of wet $N_2$ followed by binder burnoff in a steam ambient. Subsequently, the atmosphere was replaced with a forming gas atmosphere and then the temperature was ramped up to 975° C. in $N_2$. The atmosphere was then changed to a steam ambient and heating at 975° C. continued to complete the second step. The laminates were then cooled down, first in the steam ambient and then in $N_2$.

After sintering, the MLC substrates were tested for continuity and zero opens were found in all the substrates. The substrates then were made to undergo a severe testing regimen consisting of 160 thermal stress cycles of a temperature delta of 220° C. followed by 80 thermal stress cycles of a temperature delta of 400° C. After the final set of thermal cycles, the substrates were tested again for continuity. Those four substrates without the transition layer failed indicating that each of the four substrates had at least 90 opens per substrate. On the other hand, those substrates with the transition layer suffered zero opens, thereby effectively demonstrating the advantageous aspects of the invention.

Examples II

A series of samples were prepared consisting of copper particles and a crystallizable glass to demonstrate the densification behavior of the composite via materials. Some of the samples also contained copper aluminate ($CuAl_2O_4$). The crystallizable glass is of the type shown in Table I.

Batches of copper powder particles having a a particle size of predominantly 5.1-7.5 microns were mixed with crystallizable glass particles of average particle size of 3.5 microns and various paste additives, including ethyl cellulose resin plus a solvent, wetting agent and flow control agent. Some of the batches included copper aluminate of average particle size of 2.5 microns which upon sintering reduced to alumina. Each batch was dried in an oven at about 100° C. and then milled in a rod mill for 1-2 hours. Thereafter, the paste was pressed into pellets at about 5000 psi. As a comparison, pellets were made that contained crystallizable glass only and copper particles only. Finally, the pellets were sintered as in Examples I.

The shrinkage behavior of the pellets was measured during the sintering cycle by a dilatometer. It was important to determine whether the composite pellets containing the crystallizable glass and the copper would densify in a manner similar to that containing the crystallizable glass alone. The crystallizable glass crystallizes at a temperature Tc, after which there is no further shrinkage. Thus, it is useful to measure the shrinkage of the composite pellets after Tc. It has also been found useful to measure the shrinkage between 750° and 800° C. (prior to Tc) and compare it to the shrinkage of the pellets containing the crystallizable glass alone.

The results are summarized in Table II. The volume percent of the glass is based on the total solids content of the pellets.

TABLE II

| Glass Volume | $CuAl_2O_4$ Volume % | Final Density, % of Theoretical | % Shrinkage between 750-800° C. | % Shrinkage after Tc |
|---|---|---|---|---|
| 6 | 0.4 | 92.2 | 2.06 | 2.4 |
| 8 | 0.4 | 92.3 | 1.09 | 1.1 |
| 10 | 0.4 | 91.6 | 1.31 | 2.1 |
| 30 | 0.0 | 92.1 | 1-2 | −6.3 |
| 45 | 0.0 | 95-97 | 0.5-1.0 | 0.0 |
| 60 | 0.0 | 95-97 | 0.6 | 0.0 |
| 100 | 0.0 | 98-99 | 0.3 | 0.0 |
| Cu paste | 0-400 ppm $Al_2O_3$ | 93-95 | 0.5-1.5 | 8-12 |

It has been found that a minimum amount Of about 6 volume % glass ceramic is necessary to closely match the densification behavior of the bulk glass ceramic which is listed as 100 volume % in Table II. The about 2% shrinkage between 750°-800° C. and after Tc is considered to be acceptable. As the amount of glass ceramic increases, the shrinkage of the composite via more closely approaches that of the bulk glass ceramic. The samples with 45 and 60 volume % glass ceramic exhibit densification behavior which is substantially identical to that of the bulk ceramic. Thus, as an illustration of the invention, a composite via with 60 volume % glass ceramic would be ideal for the sealing layer and a composite via with 45 volume % glass ceramic would be ideal for the transition layer, although as demonstrated in Examples I, the transition layer vias with 10 volume % glass worked well in practice. Added advantages of a transition layer with 10 volume % glass are twofold. The first is that the composition has much lower resistivity, which in fact approaches that of pure copper. The second is that lines can be screened with this composition. Compositions with higher volume % of glass are difficult to use for screening lines. For fine lines, high glass contents cannot be used for screening. The sample with 30 volume % glass exhibited some expansion after Tc.

It has also been found to be advantageous to add the copper aluminate (or alumina particles) to the via composition, particularly at lower volume percentages of glass ceramic. For the samples with 6, 8 and 10 volume % glass ceramic, it has been found that 0.4 volume % copper aluminate is optimum. At larger amounts of glass ceramic, such as 45 and 60 volume %, the copper aluminate is not necessary. The expansion with the 30 volume % glass ceramic could have been reduced or eliminated with small amounts of copper aluminate or alumina particles.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A multilayer ceramic substrate for electronic applications comprising:
   (a) at least one internal layer having vias filled with a metallic material;
   (b) at least one sealing layer having vias filled with a composite material that is a mixture of ceramic and metallic materials; and
   (c) at least one transition layer located between the internal and sealing layers having vias filled with a composite material that is a mixture of ceramic and metallic materials but having less ceramic and more metallic material than the sealing layer vias and less metallic material than the internal layer vias, wherein the vias from the at least one sealing layer, the vias from the at least one transition layer, and the vias from the at least one internal layer, respectively, are in alignment with each other.

2. The ceramic substrate of claim 1 wherein the internal layer vias further comprise a ceramic material in an amount less than that present in the transition layer vias.

3. The ceramic substrate of claim 1 wherein the ceramic substrate further comprises a top surface and a bottom surface and each of the top and bottom surfaces comprise at least internal, transition and sealing layers with the layers arranged so that the internal layers are internal to the ceramic substrate and the sealing layers are toward the outer periphery of the ceramic substrate.

4. The ceramic substrate of claim 1 wherein there are a plurality of internal layers.

5. The ceramic substrate of claim 1 wherein there are a plurality of sealing layers.

6. The ceramic substrate of claim 1 wherein there are a plurality of transition layers.

7. The ceramic substrate of claim 6 wherein the vias in the plurality of transition layers have the same composition.

8. The ceramic substrate of claim 6 wherein the vias in each of the transition layers have compositions that differ from the vias in each of the other transition layers and are arranged in order so that the transition layer vias with the least amount of ceramic material are adjacent to the internal layer vias and the transition layer vias with the greatest amount of ceramic material are adjacent to the sealing layer vias.

9. The ceramic substrate of claim 1 further comprising:
   at least one additional internal layer having vias filled with a metallic material; and
   at least one additional transition layer adjacent to said additional internal layer, the additional transition layer having vias filled with a composite material that is a mixture of ceramic and metallic materials.

10. A multilayer glass ceramic substrate for electronic applications comprising:
    (a) at least one internal layer having vias filled with a metallic material;
    (b) at least one sealing layer having vias filled with a composite material that is a mixture of glass ceramic and metallic materials; and
    (c) at least one transition layer located between the internal and sealing layers having vias filled with a composite material that is a mixture of glass ceramic and metallic materials but having less glass ceramic and more metallic material than the sealing layer vias and less metallic material than the internal layer vias, wherein the vias from the at least one sealing layer, the vias from the at least one transition layer, and the vias from the at least one internal layer, respectively, are in alignment with each other.

11. The ceramic substrate of claim 10 wherein the internal layer vias further comprise a ceramic material in an amount less than that present in the transition layer vias.

12. The ceramic substrate of claim 11 wherein the ceramic material in the internal layer vias is alumina.

13. The ceramic substrate of claim 11 wherein the ceramic material in the internal layer vias is glass ceramic.

14. The ceramic substrate of claim 10 wherein the ceramic substrate further comprises a top surface and a bottom surface and each of the top and bottom surfaces comprise at least internal, transition and sealing layers with the layers arranged so that the internal layers are internal to the ceramic substrate and the sealing layers are toward the outer periphery of the ceramic substrate.

15. The ceramic substrate of claim 10 wherein there are a plurality of internal layers.

16. The ceramic substrate of claim 10 wherein there are a plurality of sealing layers.

17. The ceramic substrate of claim 10 wherein there are a plurality of transition layers.

18. The ceramic substrate of claim 17 wherein the vias in the plurality of transition layers have the same composition.

19. The ceramic substrate of claim 17 wherein the vias in each of the transition layers have compositions that differ from the vias in each of the other transition layers and are arranged in order so that the transition layer vias with the least amount of glass ceramic material are adjacent to the internal layer vias and the transition layer vias with the greatest amount of glass ceramic material are adjacent to the sealing layer vias.

20. The ceramic substrate of claim 10 further comprising:
    at least one additional internal layer having vias filled with a metallic material; and
    at least one additional transition layer adjacent to said additional internal layer, the additional transition layer having vias filled with a composite material that is a mixture of glass and metallic materials.

21. The ceramic substrate of claim 10 wherein the via composition of the sealing layer vias comprises 40 to 90 volume % glass ceramic and 60 to 10 volume % metallic material.

22. The ceramic substrate of claim 21 wherein the metallic material is selected from the group consisting of copper, silver, palladium and gold.

23. The ceramic substrate of claim 10 wherein the via composition of the transition layer vias comprises at least about 6 volume % glass ceramic material.

24. The ceramic substrate of claim 10 wherein the glass ceramic material is selected from the group consisting of cordierite and spodumene.

25. A method of fabricating a multilayer ceramic substrate for electronic applications, the multilayer ceramic substrate comprising at least one internal layer having vias filled with a metallic material and at least one sealing layer having vias filled with a composite material that is a mixture of ceramic and metallic materials, the method comprising the step of:

interposing at least one transition layer between the internal layer and the sealing layer, the transition layer having vias filled with a composite material that is a mixture of ceramic and metallic materials but having less ceramic and more metallic material than the sealing layer vias and less metallic material than the internal layer vias, wherein the vias from the at least one sealing layer, the vias from the at least one transition layer, and the vias from the at least one internal layer, respectively, are in alignment with each other.

26. The method of claim 25 wherein the internal layer vias further comprise a ceramic material in an amount less than that present in the transition layer vias.

27. The method of claim 25 wherein the ceramic substrate further comprises a top surface and a bottom surface and each of the top and bottom surfaces comprise at least internal, transition and sealing layers with the layers arranged so that the internal layers are internal to the ceramic substrate and the sealing layers are toward the outer periphery of the ceramic substrate.

28. The method of claim 25 wherein there are a plurality of internal layers.

29. The method of claim 25 wherein there are a plurality of sealing layers.

30. The method of claim 25 wherein there are a plurality of transition layers.

31. The method of claim 30 wherein the vias in the plurality of transition layers have the same composition.

32. The method of claim 30 wherein the vias in each of the transition layers have compositions that differ from the vias in each of the other transition layers and are arranged in order so that the transition layer vias with the least amount of ceramic material are adjacent to the internal layer vias and the transition layer vias with the greatest amount of ceramic material are adjacent to the sealing layer vias.

* * * * *